(12) United States Patent
Hyldgaard et al.

(10) Patent No.: US 7,390,527 B2
(45) Date of Patent: Jun. 24, 2008

(54) METHOD FOR MANUFACTURING A NANOSTRUCTURE AT A PREDETERMINED POINT ON SUPPORTING CARRIER

(75) Inventors: Per Hyldgaard, Göteborg (SE); Dinko Chakarov, Lindome (SE); Bengt Lundqvist, Ljungskile (SE)

(73) Assignee: Chalmers Intellectual Property Rights AB, Göteborg (SE)

( * ) Notice: Subject to any disclaimer, the term of this patent is extended or adjusted under 35 U.S.C. 154(b) by 148 days.

(21) Appl. No.: 10/500,384

(22) PCT Filed: Dec. 30, 2002

(86) PCT No.: PCT/SE02/02461

§ 371 (c)(1),
(2), (4) Date: Dec. 14, 2004

(87) PCT Pub. No.: WO03/055793

PCT Pub. Date: Jul. 10, 2003

(65) Prior Publication Data

US 2005/0100736 A1 May 12, 2005

(30) Foreign Application Priority Data

Dec. 28, 2001 (SE) .................................. 0104452

(51) Int. Cl.
*B05D 5/12* (2006.01)
*B05D 3/00* (2006.01)
*C23C 14/00* (2006.01)

(52) U.S. Cl. ........................ 427/58; 427/523; 427/551

(58) Field of Classification Search ................ 427/402, 427/58, 551–559, 523–534
See application file for complete search history.

(56) References Cited

U.S. PATENT DOCUMENTS

| 5,665,648 | A  | * | 9/1997  | Little ......................... 438/117 |
| 6,103,399 | A  | * | 8/2000  | Smela et al. ................ 428/623 |
| 6,350,488 | B1 | * | 2/2002  | Lee et al. ................. 427/249.1 |
| 6,808,746 | B1 | * | 10/2004 | Dai et al. ................. 427/249.1 |
| 2004/0018139 | A1 | * | 1/2004 | Mancevski ............... 423/447.3 |
| 2004/0043219 | A1 | * | 3/2004 | Ito et al. ..................... 428/408 |

OTHER PUBLICATIONS

D.C. Chung, et al., "Field Emission Display Using Self-Aligned Carbon Nanotube Field Emitters," Vacuum Microelectronics Conference 2001, IV Proceedings of the 14th International, Davis, CA, USA, 2001, pp. 179-180.

(Continued)

*Primary Examiner*—Brian K. Talbot
(74) *Attorney, Agent, or Firm*—Harness, Dickey & Pierce, P.L.C.

(57) ABSTRACT

A method is for manufacturing a nanostructure in-situ, at least one predetermined point on a supporting carrier. The method includes choosing a suitable material for a substrate in the carrier, creating the substrate, and preparing a template on the substrate so that the template covers the predetermined point. The template is given a proper shape according to the desired final shape of the nanostructure, and a film of nanosource material with desired dimensions is formed on the template. The film of nanosource material is made to restructure from a part of the template, thus forming the desired nanostructure. Suitably, the template includes a first and a second area which have different properties with respect to the nanosource material.

39 Claims, 9 Drawing Sheets

OTHER PUBLICATIONS

Paul L. McEuen. et al., "Single-Walled Carbon Nanotube Electronics," Nanotechnology IEEE Transactions on Nanotechnology, Mar. 2002, vol. 1, No. 1, pp. 78-85.

David S.Y. Hsu. et al., "Gated In-Situ Grown Carbon Nanotube Field Emitter Arrays," Vacuum Microelectronics Conf. 2001, IV Proceedings of the 14th International, Davis, CA 2001, pp. 51-52.

* cited by examiner

FIG. 1a-e

METHOD FOR MANUFACTURING A NANOSTRUCTURE AT A PREDETERMINED POINT ON SUPPORTING CARRIER

TECHNICAL FIELD

The present invention relates to a method for manufacturing a nanostructure in-situ at a predetermined point on a supporting carrier, and also to such a nanostructure device. In addition, the invention relates to electronics devices comprising a nanostructure made according to the method of the invention.

BACKGROUND OF THE INVENTION

Nanostructures, for example in the shape of tubes, so called nanotubes, are structures which offer a number of new and interesting functionalities in, for example, the field of electronics. At present, however, there are difficulties associated with the manufacturing of nanostructures. Nanotubes, for example, are at present produced by means of a variety of procedures, which all have the common drawback that the nanotubes produced in these ways need a significant amount of postprocessing, and also need additional manipulation in order to be incorporated into devices.

DISCLOSURE OF THE INVENTION

The purpose of the invention is thus to solve the mentioned drawbacks of contemporary nanostructure technology, with a nonexclusive emphasis on nanotubes.

This purpose is achieved by a method for manufacturing a nanostructure in-situ at at least one predetermined point on a supporting carrier, which method comprises the steps of choosing a suitable material for a substrate to be comprised in the carrier, creating said substrate, and preparing a template on the substrate, wherein the template covers said predetermined point. The template is given a proper shape according to the desired shape of the final nanostructure, and a film of nanosource material with desired thickness, width and length is caused to be formed on the template. At least a part of the film of nanosource material is caused to restructure from a part of the template, thus forming the desired nanostructure at the predetermined point.

Said restructuring is in the form of a reassembling on the atomic scale of the nanosource material, resulting in qualitatively new properties relative to the properties of the nanosource material prior to the restructuring, said new properties being manifested in an altered, predefined response to external fields or forces.

The expression "qualitatively new properties" should here be taken to mean such fundamental changes in physical and/or chemical properties as, for example, a material which was transparent previous to the restructuring transitioning into being opaque, a conducting material becoming non conducting, a magnetic material becoming nonmagnetic, or materials changing optical and conduction responses by an effective restriction of the electron dynamics to lower dimensions, etc. Other examples of such transitions will be apparent to the man skilled in physics and/or chemistry. Said template preferably comprises two areas which have different properties with respect to their interaction with the nanosource material. In one embodiment of the present invention, this is done by one of the areas having stronger adhesive properties than the other with respect to the nanosource material.

By means of the method of the invention, virtually any nanostructure can thus be manufactured in-situ on a carrier, with the desired final shape of the nanostructure being obtained by giving the template the proper shape according to the desired shape of the nanostructure. The template may thus serve both as an aligning structure for the nanostructure, and as a bonding material for attaching the nanostructure to the carrier.

The invention thus also offers a nanostructure device, comprising a carrier and a nanostructure positioned on said carrier, said nanostructure extending along a predetermined path on the carrier, with the device additionally comprising an aligning structure, which aligns the nanostructure along said predetermined path on the carrier., the device also comprising a layer of material positioned on the carrier, said material being a bonding material for attaching the nanostructure to the carrier, which also serves as an aligning structure for the nanostructure.

In addition, the invention makes it possible to manufacture electronics devices, for example semiconducting devices, comprising nanotubes.

BRIEF DESCRIPTION OF THE DRAWINGS

The invention will be described in closer detail below, with the aid of the appended drawings, in which.

EMBODIMENTS

Figure 1:
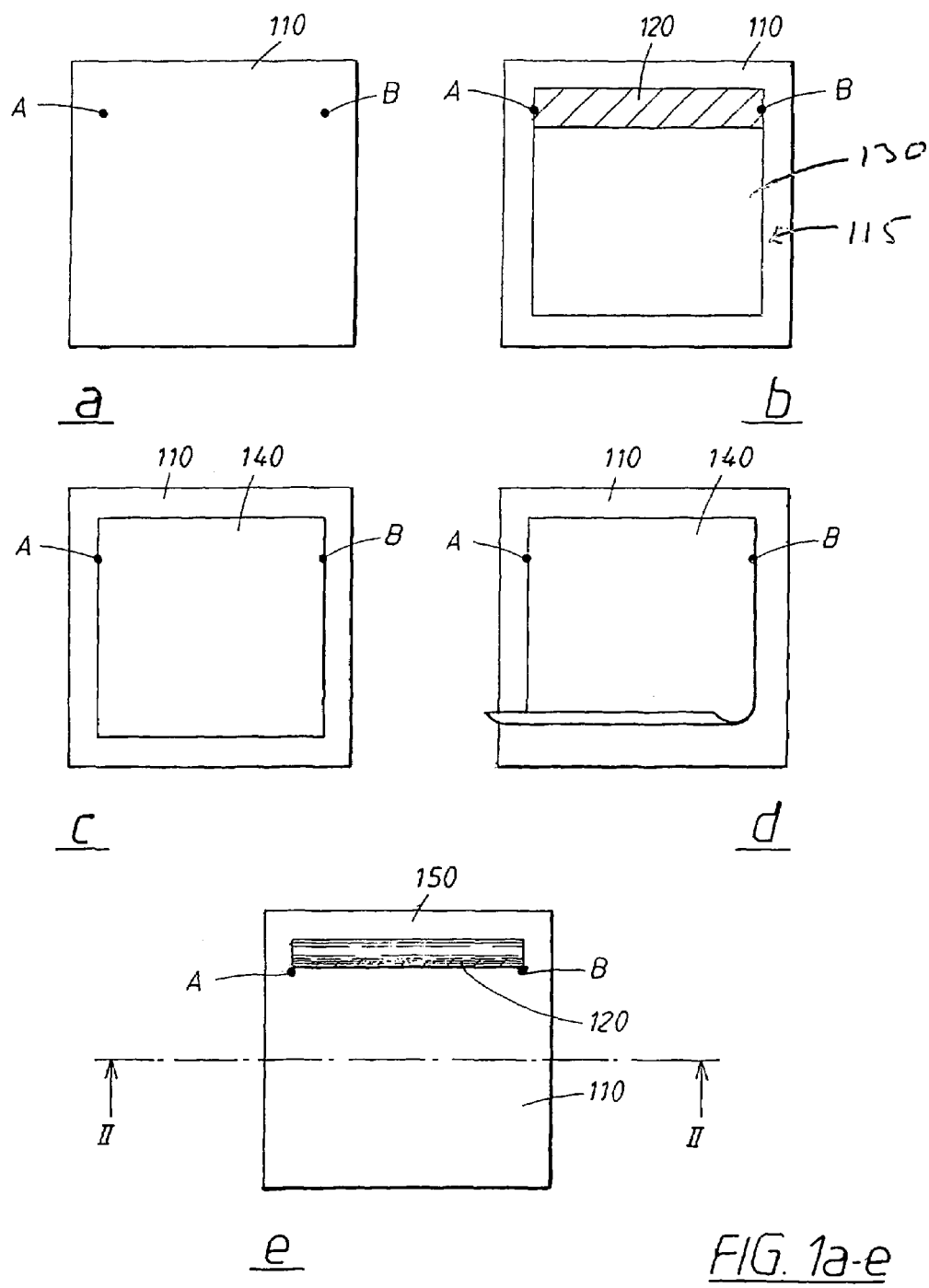
FIGS. 1a-1e schematically shows the main steps in a manufacturing process according to the invention.

In FIG. 1, the main steps in a process according to the invention are shown. In order to facilitate the understanding of the invention, an embodiment of the invention in which a specific nanostructure, a nanotube, is formed, will be described. However, it should be kept in mind, and will become apparent to one skilled in the art, that a large number of different nanostructures can be formed using the present invention.

The main steps of the illustrative process will first be described briefly, following which a more detailed description of some of the steps will be given.

The main steps are as follows:

A material is chosen for a substrate 110, which will act as a carrier. There are two points, A and B on the substrate 110, which it is desired to connect via a nanostructure, in this case a nanotube, which extends along a predetermined path, in this case the shortest distance, i.e. a straight line, between said two points. however, it should become obvious to one skilled in the art that the invention enables a nanostructure to be designed which will follow more or less any predetermined path on the substrate or carrier.

On the substrate 110, a template 115 is formed, so that the template connects the two points A and B, i.e. the template or at least its edges coincides with the predetermined path. Since the nanostructure that it is desired to shape in this example of an embodiment is a nanotube, the template is given essentially rectangular dimensions, for reasons which will become apparent below. However, if it is desired to have a nanostructure of a different shape, this can easily be accomplished by means of the invention, by shaping the template in a manner according to the shape of the desired nanostructure.

The template 115 preferably comprises a first 120 and a second 130 area, said two areas being distinct from each other in that the material of the areas exhibit different properties in a way which will be described below.

On the template, a film 140 of nanosource material is formed. The materials of the two template areas 120, 130 exhibit different properties towards the nanosource material in their interaction with the nanosource material.

In this particular embodiment, the different interaction with the nanosource material lies in that the materials of the two template areas have different adhesive properties towards the nanosource material, the material of one area having stronger adhesive properties than the other. The significance of the different adhesive properties will become apparent in the next step, which in this example is the so called exfoliation of the film:

At least part of the film 140 is caused to exfoliate, in other words to "lift" at least in part from the template area 115. Due to the different adhesive properties of the different template areas 120, 130, if the exfoliation is done in a controlled manner according to the invention, only that part of the film 140 which is formed on the template area 130 which has the weaker adhesive properties towards the film will exfoliate, whereas that part of the film which is formed on the area 120 with the stronger adhesive properties will not exfoliate. Rather, this part of the film will serve as an "anchor" for the part of the film which exfoliates, i.e. a fixed point for the future nanostructure, in this case a nanotube 150, as shown in FIG. 1e.

It should be pointed out that the exfoliation of the film is a particular case of a more general aspect of the invention: parts of the film are caused to rise from the template, and to form into new structures. The action by the film when the template is shaped to make the film into a nanotube is exfoliation. However, a more general term for this step of the invention is that the film is made to "restructure" from the template, and to then form the desired final shape of the nanostructure.

An important feature of the present invention can be pointed out and emphasized here: the restructuring mentioned is in the form of a reassembling on the atomic scale of the nanosource material, resulting in qualitatively new properties relative to the properties of the nanosource material prior to the restructuring. These new properties are manifested in an altered, predefined response to external fields or forces.

The expression "qualitatively new properties" here refers to such fundamental changes in physical and/or chemical properties as, for example, a material which was transparent previous to the restructuring transitioning into being opaque, a conducting material becoming nonconducting, a magnetic material becoming nonmagnetic, etc. Other examples of such transitions will be apparent to the man skilled in physics and/or chemistry. The new properties of the material will be known in advance to those utilising the invention, so that the "post-transition" material will exhibit one or more desired physical or chemical properties.

With renewed reference to FIG. 1, part of the film 140 will restructure thus from the template by way of exfoliation, and the layer of material 140 will now form the desired nanotube 150, which extends along the predetermined path, i.e. connects the two points A and B. The nanotube 150 is bonded to the substrate or carrier by means of the stronger bonding template area 120. Thus, the template serves both as an aligning structure for the nanotube, and as a bonding structure for it.

Naturally, a number of conditions should be fulfilled in order for the process described above in connection with FIG. 1 to work in an optimal fashion, said conditions being apparent to one skilled in surface science. For instance, the entire process needs to take place in a controlled environment, so that the materials involved are not contaminated during the process.

In addition, the materials should fulfil the following requirements:

The substrate material: the material chosen for the substrate should exhibit a desired mechanical strength, and should, in addition, in one preferred embodiment be a material on which the nanosource material can not grow/be deposited. One example of a suitable substrate material in electronics components which can be mentioned is silicon.

The template material: As mentioned above, two different template materials are used, with different adhesive properties with respect to the nanosource material. One possibility is to use the same basic material for both areas, and to then introduce defects into one of the areas in order to create differing adhesive properties. Examples of such defects are grain boundaries, step edges, dislocations, impurities or line edges. One possible material for the template is, for example, silicon carbide, SiC, or Aluminum Oxide. Other examples of suitable template materials are nickel and/or cobalt.

Another distinct possibility would be to use the substrate as a template area also, and to then introduce defects into the areas intended to have template properties, i.e. stronger or weaker bonding properties, the strength being determined by the material introduced as an impurity, and the amount of that material. Thus, one area of the substrate can act as the stronger bonding material, "the anchor", and another area of the substrate can be induced with defects which make that area an area with weaker bonding properties, or vice versa.

The nanosource material: examples of suitable nanosource materials are magnesium diboride, graphite, silicon or boron nitride.

Figure 2:
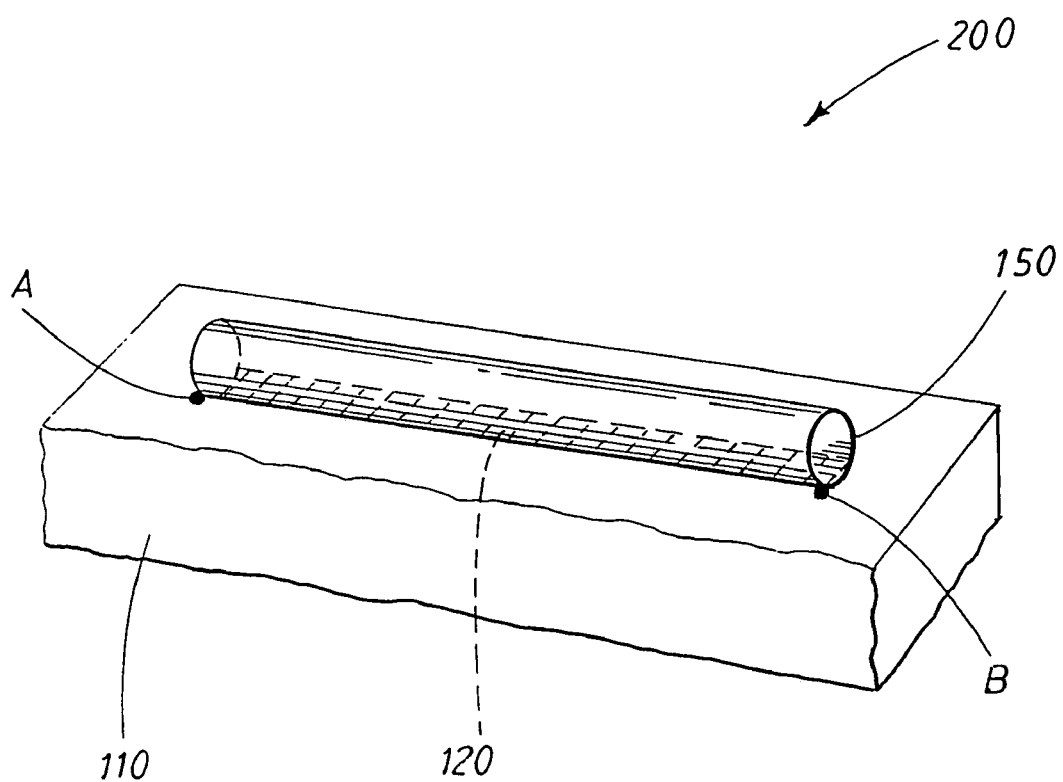
FIG. 2 shows a nanotube manufactured according to the invention, along the line II-II in FIG. 1, FIGS. 3a and 3b show other views of FIGS. 1 and 2, respectively.

FIG. 2 shows, among other things, the nanotube 150 along the line II-II of FIG. 1, seen in a side view. Thus, FIG. 2 shows a nanostructure device 200, comprising a carrier 110 and a nanostructure 150 in the shape of a tube positioned on the carrier, where the nanotube 150 connects two points A, B on the carrier. The device 200 additionally comprises an aligning structure 120, here in the form of the template material 120, but it should be pointed out that other ways of bonding the nanotube to the carrier can be envisioned within the scope of the invention.

However, the device shown in FIG. 2 comprises a layer 120 of material positioned between the nanotube 150 and the carrier 110, with the material 120 being a bonding material for attaching the nanotube to the carrier. As described above, the material 120 also serves as an aligning structure for aligning the nanotube 150 between the desired points A and B on the carrier, so that the longitudinal extension of the tube coincides with the extension of the aligning structure between the two points on the carrier.

Figure 3A:
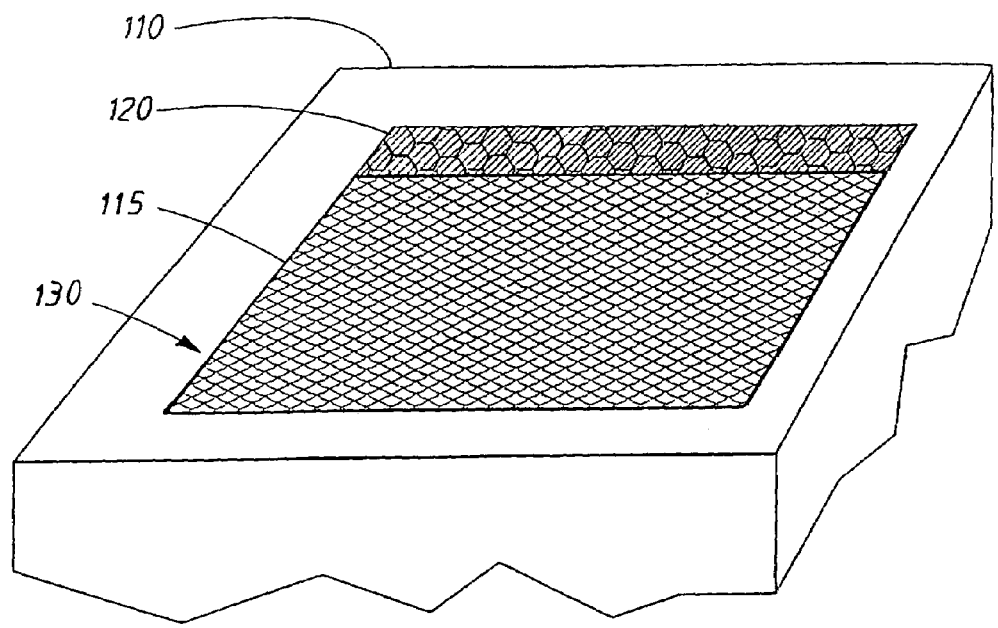
Figure 3B:
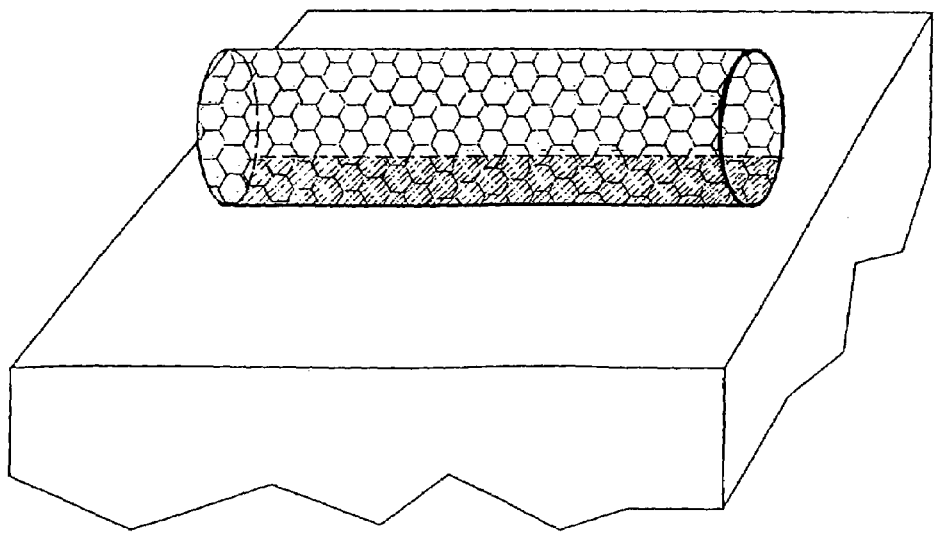

FIGS. 3a and 3b show other views of FIGS. 1 and 2, respectively. In FIG. 3a, the substrate 110, and the template 115 are shown, as well as the different areas 120, 130 of the template. On top of the template areas, the film 140 of nanosource will be deposited. By means of FIG. 3a, it should become apparent that the position, orientation and deformation (by means of the restructuring, in this case the exfoliation) of the future nanotube can be controlled completely by means of the invention, since the orientation and position of the template decides the corresponding parameters of the future nanotube. It should also be mentioned that the shape of the nanostructure can be controlled by means of controlling the shape of the template. This means that although only rectangular templates are shown in this description, it is entirely within the scope of the invention to shape a nanostructure in more or less any desired structure by creating the proper corresponding template.

FIG. 3b shows the device of FIG. 3a, following exfoliation of the film of nanosource material. Thus, in FIG. 3b, there is a nanotube-which connects two desired points on a substrate, the nanotube being bonded to the substrate by means of a bonding material which was, in this case, also used as a guiding structure for determining the extension and position of the nanotube. The material of the nanotube is shown as a honeycomb pattern, for reasons which will become apparent later in this description.

The points which are connected by the nanotube can, for example, be electrical contacts, if the nanotube is to be comprised in an electronics device.

The exfoliation of the film of nanosource material, i.e. the step between FIGS. 3a and 3b is preferably carried out by providing additional energy to the film of nanosource material. This can be done in a large number of ways which should be apparent to the man skilled in the field, but one such method which can be mentioned is, for example, by means of a laser beam, an ion beam or an electron beam which illuminates at least part of the film of nanosource material.

Additionally, the exfoliation can be done by means of doping at least part of the material of the film of nanosource material, following its deposition on the template areas.

Furthermore, the additional energy does not need to be supplied in equal amounts over the area of nanosource material, the additional energy can, for example, be provided to a section of that part of the nanosource material which has been deposited on the area of the template which has the weaker adhesive properties.

The nanosource material can be deposited on the template area in a large number of different ways, which as such are known. Some such methods which can be mentioned as examples are sputtering or evaporation of the material.

One of many interesting materials to use as nanosource material is the element carbon, particularly if the nanostructures, in this example tubes, are to be used for conducting electrical current, i.e. if the nanotube is to be comprised in an electronics component or device. In such an application, it is particularly advantageous if the carbon is deposited on the template in the form of a graphene sheet. Graphene can be defined as single atomic layer graphite. Naturally, although the invention will be described using a film of one graphene sheet, one or more graphene sheets can be used in the film of the invention.

Figure 4A:
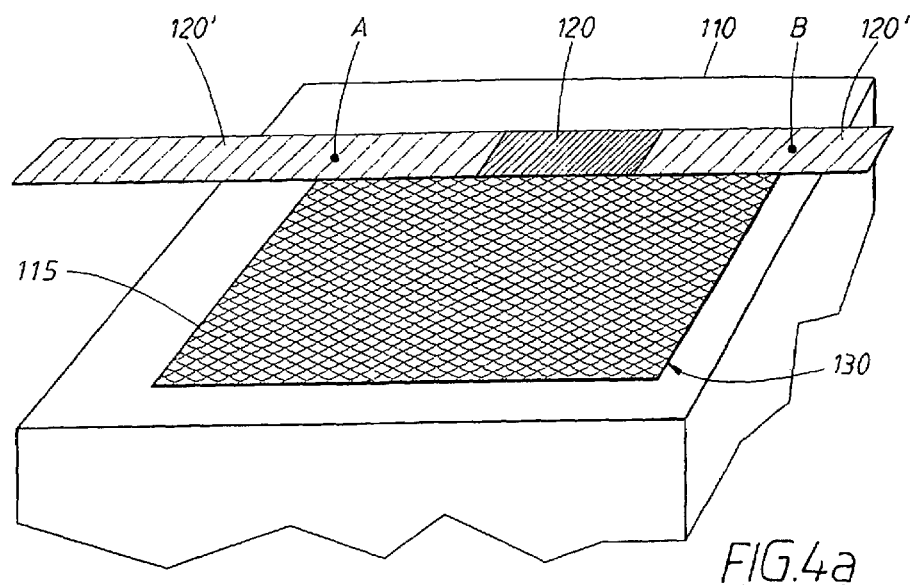
FIGS. 4a-b and 5a-b show the integration of a nanotube according to the invention in an electronics device.
Figure 4B:
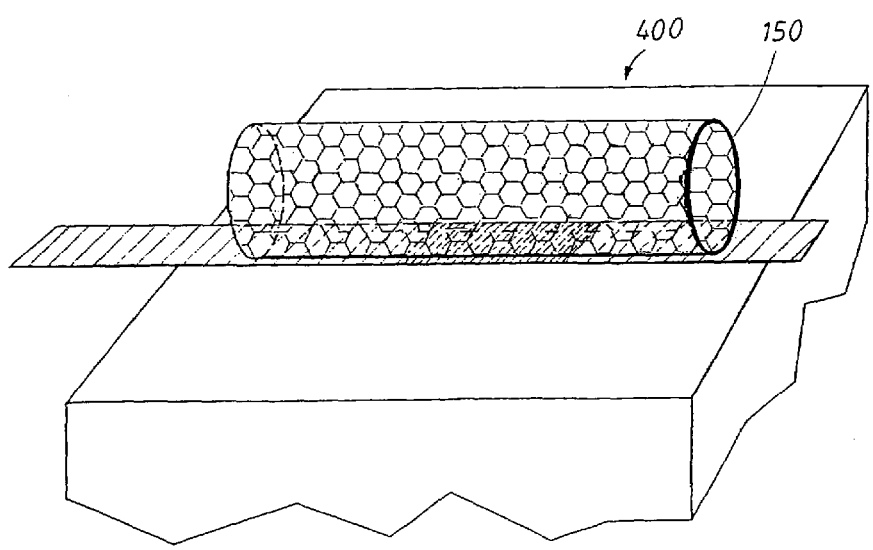

FIGS. 4a and 4b show how a nanotube made according to the invention, using a graphene sheet as nanosource material, can be integrated into an electronics component or device. Since the nanotube is to be used for conducting current along a predetermined path between two points, contacts for external devices should be incorporated into the nanotube device, which will be explained in connection to FIGS. 4a and 4b.

In FIG. 4a, the substrate 110 of the previous figures can be seen, as well as the different template areas 130 (weak bond) and 120 (strong bond). However, the difference compared to the previous structures is, as will be evident from the figure, that the template area 120 which has the stronger bond to the nanosource material now comprises two contact areas 120', which can cover or constitute parts of the area 120, for example, as shown in FIG. 4a, its end areas. Said two contact areas 120' are also suitably arranged so that they will protrude at least slightly from the future nanotube, i.e. in this case they protrude outside the edges of the rest of the template.

In FIG. 4b, the end result is shown: a sheet of graphene film has been deposited on the template, and exfoliated from it so as to form a tube, in the manner described above. The result is a nanotube 150, which connects two parts on the substrate 110, said two parts in this case being contacts for external devices. Since the resulting device 400 shown in FIG. 4b is intended to connect electrical current, the material for the contact areas should be electrically conducting, in addition to the (stronger) bonding properties described earlier. The contact areas 120' can either be formed on a previously formed film of the template material 120, or they can be formed directly on the substrate, to act directly as the bonding and aligning structure for the nanotube, as well as being contact points.

Figure 5A:
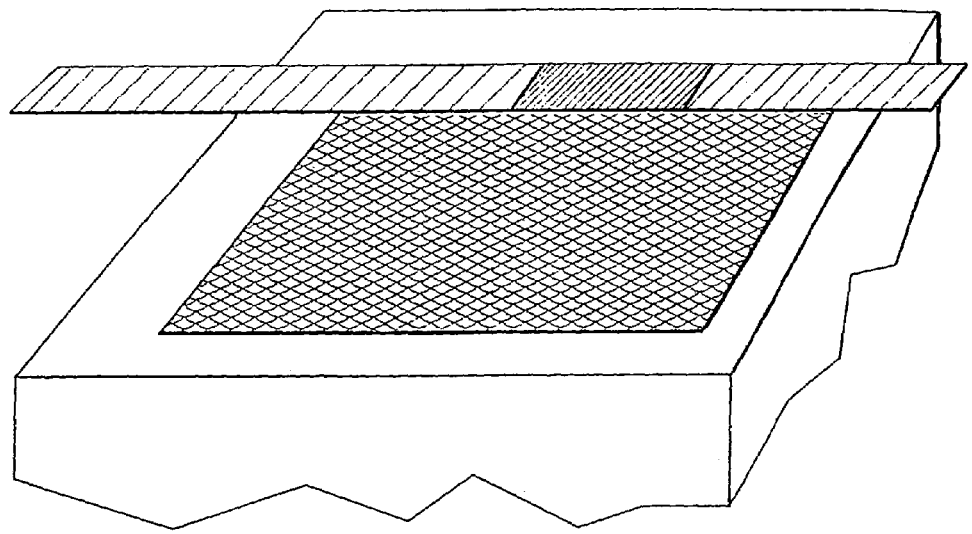
Figure 5B:
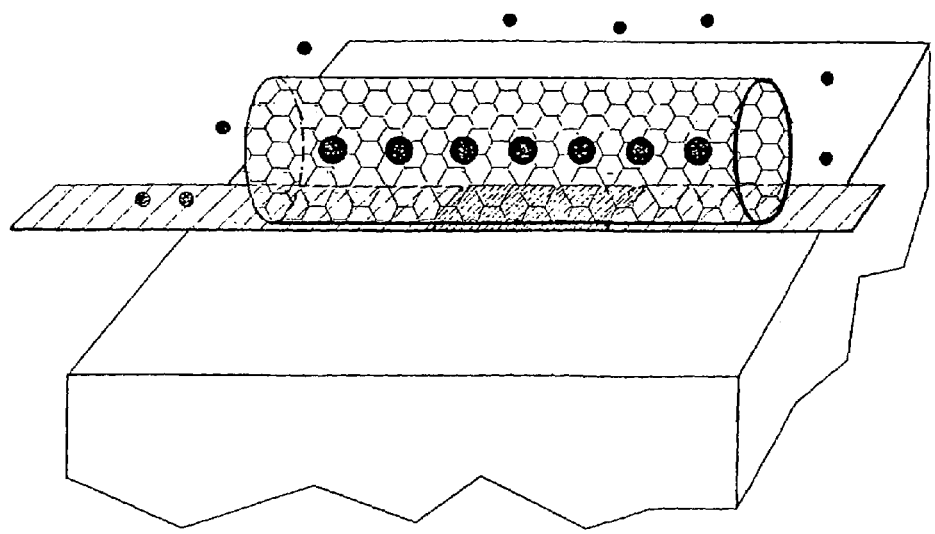

FIG. 5 basically shows the same as FIG. 4, but in the example shown in FIG. 5, the nanosource material has been doped, i.e. impurities have been introduced into the graphene sheet, thus giving the formed nanotube different conducting properties as compared to a nanotube formed of pure graphene.

Figure 6:
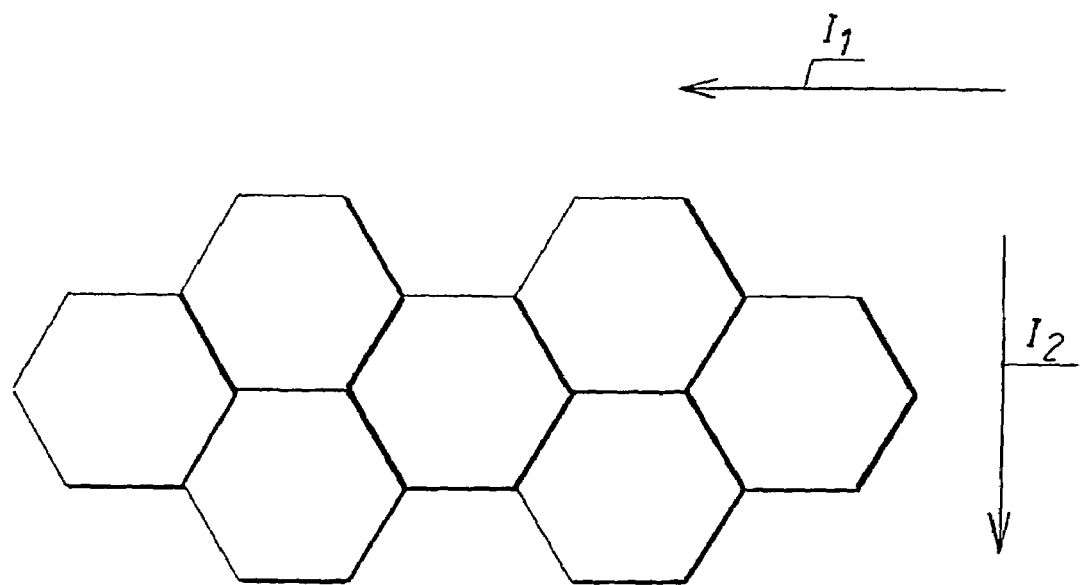
FIG. 6 shows a specific example of a nanosource material.

Turning now to graphene as a nanosource material, this material has at least one specific property which makes it extremely interesting for electronics applications: depending on the direction in which the film exfoliates, the graphene tube will exhibit different conducting properties. As shown in FIG. 6, there are two main directions in which a graphene sheet can be exfoliated, shown with the arrows 11 and 12, thus giving the resulting nanotube different so called chirality. Naturally, the film can be exfoliated in almost any direction, using the proper template shape, thus making it possible to create a nanotube with more or less any chosen chirality.

The direction of exfoliation indicated by the arrow $I_1$ in FIG. 6 will give the nanotube a chirality known as "zigzag", and the direction of exfoliation indicated by the arrow $I_2$ in FIG. 6 will give the nanotube a chirality known as 99 armchair". In more precise, scientific terminology, the "zigzag" chirality can, in terminology known to those skilled in the field, be referred to as (N,O), where N is an arbitrary integer and the "armchair" chirality can be referred to as (N, N), where N is also an arbitrary integer.

A nanotube with "armchair" chirality will exhibit conducting properties similar to those of a metallic material, i.e. the nanotube will be highly conductive, whereas a nanotube with "zigzag" chirality will exhibit conducting properties similar to those of a semiconducting material.

In other words, using a nanotube consisting of a plurality of sections in its longitudinal direction, with the different sections having been formed by exfoliation of graphene sheets in different orientations, thus giving the different sections different chirality, it is possible to obtain components for a 5 semiconductor device, for example a transistor or a diode.

Figure 7A:
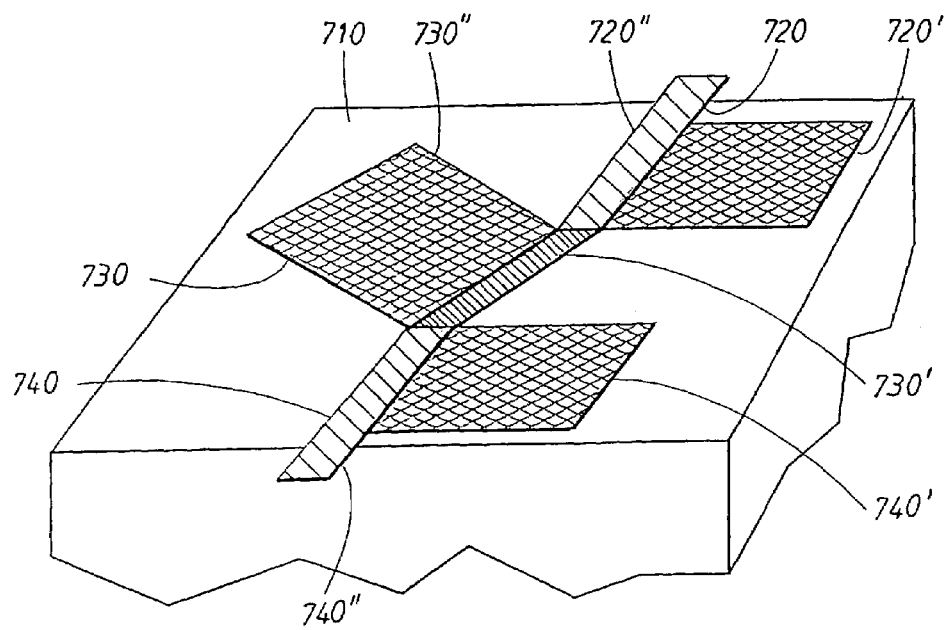
FIGS. 7a-b, 8 and 9 show nanotube semiconductor devices which can be manufactured with the aid of the invention.

A step in the making of such a semiconductor device is shown in FIG. 7a: A template area 710, consisting of, in this case, three different areas 720, 730, 740, has been arranged on a suitable substrate 750. In the manner described earlier, each of the template areas 720, 730, 740 comprise two different "sub-areas" 720'. 720", 730', 730", 740', 740", where the "sub-area" denoted by a single apostrophe, ', is an area that has weaker bonding properties with respect to the nanosource material, in this case graphene, than the "sub area" denoted by double apostrophes".

Figure 7B:
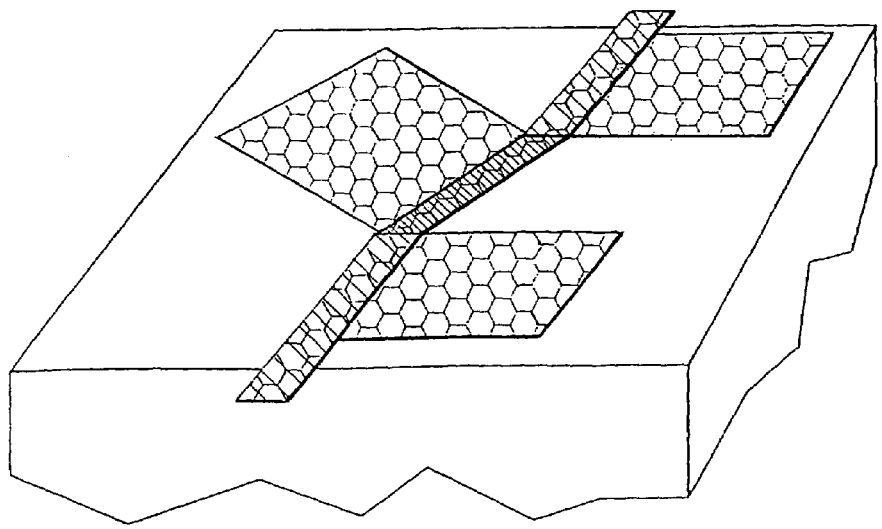

As shown in FIG. 7b, the film of nanosource material, in this case graphene, is deposited on the template areas. In the particular case shown in FIG. 7b, the object is to form a semiconductor device comprising a nanotube with three different sections in the longitudinal direction of the tube, with the two, outer sections having the conducting properties of a metal, i.e. highly conducting, and the middle section having semiconducting properties.

Thus, "sub-areas" 720 and 740 should, upon exfoliation, form a graphene nanotube with "armchair" chirality, and "sub-area" 730 should, upon exfoliation, form a graphene nanotube with "zigzag" chirality. In FIG. 7b, a very efficient way of forming nanotube sections according to the invention so that the sections will have different chiralities can be seen: it has been discovered by the inventors of the present invention that the exfoliation will take place in a direction which is essentially perpendicular towards the main extension of the "bonding area" of the template. Thus, a graphene film can be deposited more or less uniformly on a substrate on which different connecting template areas have been formed, and the exfoliated nanotube sections can still be given desired and different chiralities by virtue of the fact that the bonding areas of the individual template areas exhibit different angles with respect to one another. Thus, this method eliminates the need for depositing graphene sheets with different orientation on the different template areas, and still the same end result is achieved.

When graphene film has been formed on the template areas, exfoliation is then carried out as described above. It can be shown that the different sections bond together as one continuous tube, with "bends" if and where the angles of the bonding areas differ from one another.

The different template areas 720, 730, 740, for the various sections of the nanotube can be formed on the substrate on the same side of the future nanotube, or, as shown in FIG. 7, on alternating (left-right) sides of the future nanotube, or in other patterns. In addition, the "sub-area" with the stronger bonding properties, 720", 730", 740", can be formed in a straight line on the substrate, or, as shown in FIGS. 7a and 7b, with angles between them that are smaller or larger than 180 degrees.

It should be noted that the conducting properties of the different sections of the nanotube can be affected not only by giving the different sections different chirality: another way is to shape the template areas so that different sections of the nanotube will have different radii, thus leading to different cross-sectional areas, which will affect the conducting properties of the respective sections.

Figure 8:
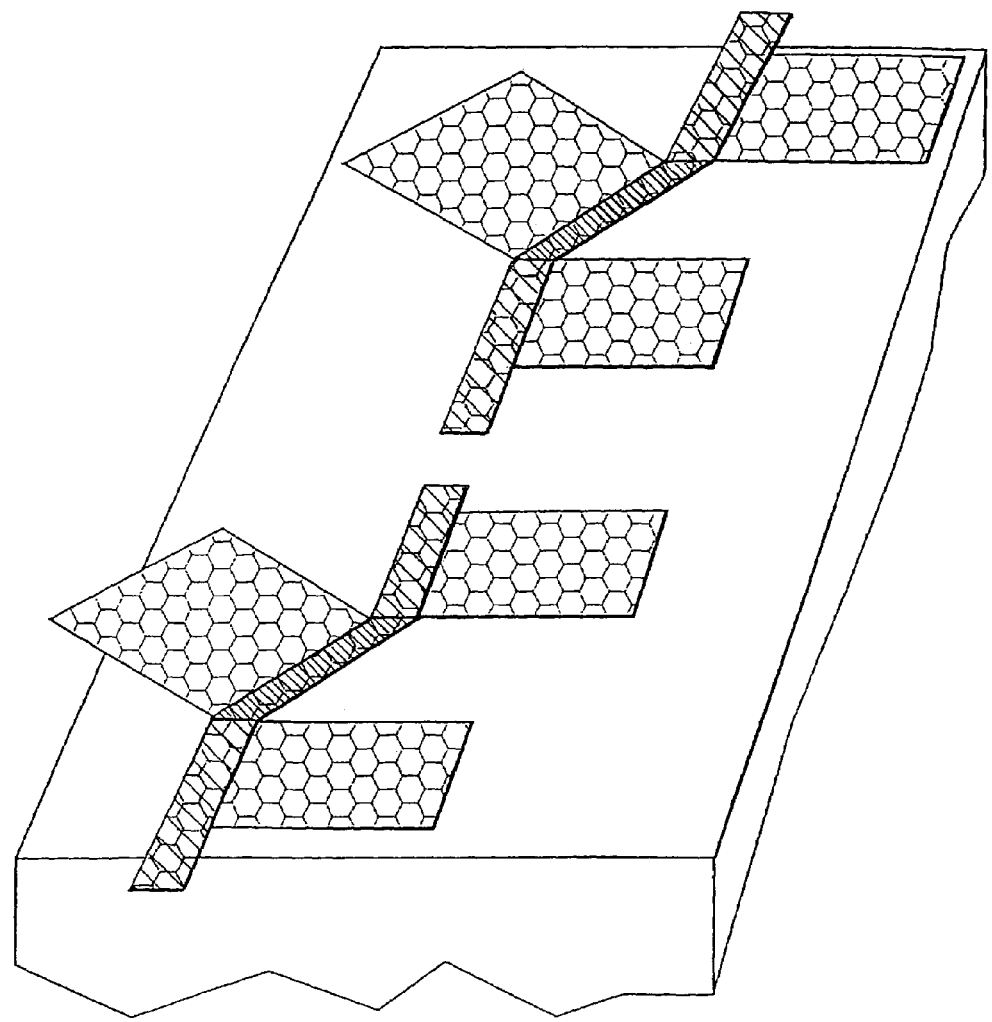
Figure 9:
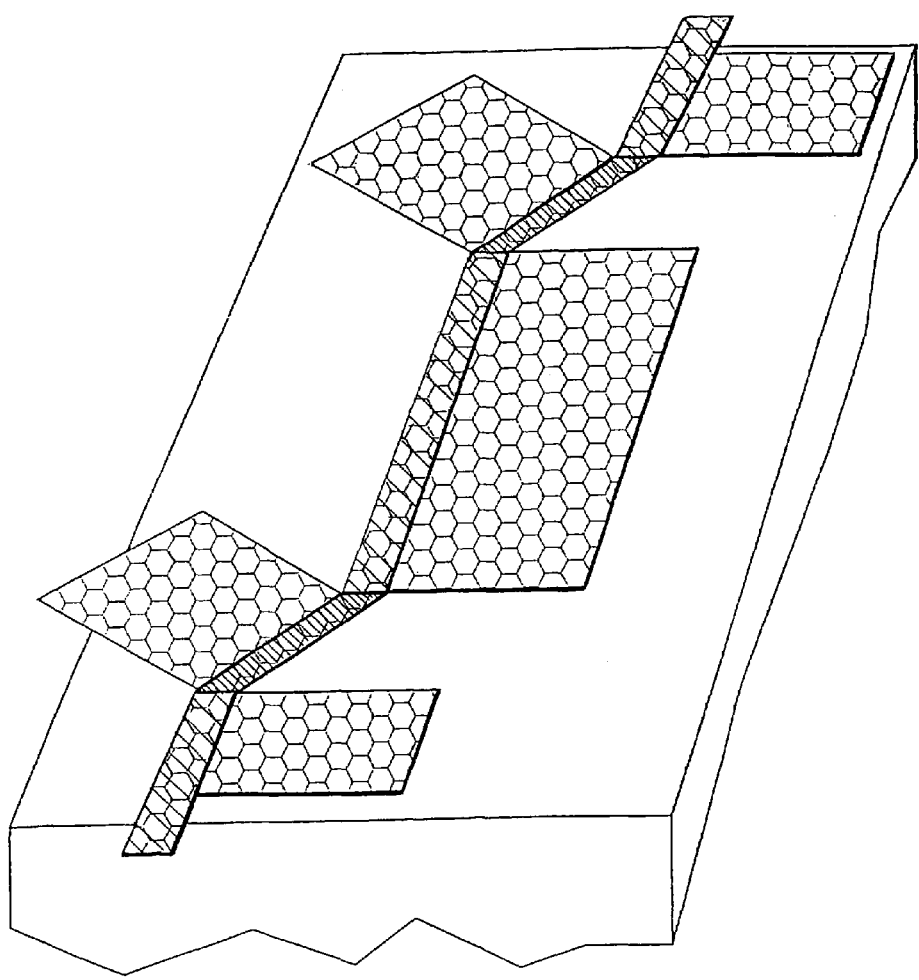

FIG. 8 shows the making of two separate semiconducting devices on one and the same substrate, using the method shown in FIG. 7 and described above, and FIG. 9 shows the making of a more complex semiconducting device than the one in FIG. 7, using the method of FIG. 7.

The invention is not limited to the embodiments which have been described above, but may be varied freely within the scope of the appended claims.

The invention claimed is:

1. A method for manufacturing a nanostructure in-situ at at least one predetermined point on a supporting carrier, the method comprising:
choosing a suitable material for a substrate to be comprised in the carrier, and creating said substrate,
preparing a template on the substrate, wherein the template covers said predetermined point, and giving said template a proper shape according to the desired final shape of the nanostructure,
causing a film of nanosource material with desired thickness, width and length to be formed on the template, and
causing at least part of the film of nanosource material to restructure from a part of the template, thus forming the desired nanostructure at the predetermined point, said restructuring being in the form of a reassembling on the atomic scale of the nanosource material, resulting in qualitatively new properties relative to the properties of the nanosource material prior to the restructuring, said new properties being manifested in an altered, pre-defined response to external fields or forces.

2. The method of claim 1, wherein the template includes a first and a second area, which have different properties with respect to their interaction with the nanosource material.

3. The method of claim 2, wherein the different properties of the two areas with respect to their interaction with the nanosource material is that one area is given stronger adhesive properties than the other.

4. The method of claim 3, according to which the area of the template that has the stronger adhesive properties with respect to the nanosource material covers the at least one predetermined point on the substrate, thus bonding the nanostructure to the carrier at that point.

5. The method of claim 1, wherein the restructuring is carried out by providing additional energy to the film of nanosource material.

6. The method of claim 5, wherein at least part of the additional energy is provided by at least one of a laser beam, ion beam and electron beam which illuminates at least part of the film of nanosource material.

7. The method of claim 1, wherein the restructuring is carried out by doping at least part of the material of the film of nanosource material.

8. The method of claim 5, wherein the additional energy or doping is provided to a section of that pan of the nanosource material which has been deposited on the area of the template whose material has the weaker adhesive properties.

9. The method,of claim 1, wherein the restructuring of the nanosource material further comprises exfoliation of a portion of the nanosource material from the part of the template.

10. The method of claim 1, wherein the nanostructure which is formed is a nanotube which connects two predetermined points on the carrier.

11. The method according to claim 1, wherein at least one of the two areas of the template is rectangular.

12. The method of claim 1, wherein the film of nanosource material which is caused to be deposited on the template is a film of graphene.

13. A method for manufacturing an electronics device, said device comprising at least a carrier and, arranged on the carrier, at least one component for conducting electrical current between two predetermined points on the cater, said method comprising:
choosing a suitable material for a substrate to be comprised in the carrier, and creating the substrate,
arranging on the substrate at least one template area, so that the two predetermined points on the carrier are in connection with a template area,
arranging a contact point for external devices to at least one of the two predetermined points,
causing a film of nanosource material with desired thickness, width and length to be deposited on at least one template area, and
causing at least one of said films of nanosource material to at least partially exfoliate from its template and to form a nanotube which connects the two predetermined points on the carrier, wherein said component for conducting electrical current is formed by said nanotube.

14. The method of claim 13, wherein the at least one contact point coincides with one of said two predetermined points.

15. The method of claim 13, wherein the contact point is prepared before the nanosource material is caused to exfoliate from its template.

16. The method of claim 13, wherein the contact point is prepared after the nanosource material is caused to exfoliate from its template.

17. The method of claim 13, wherein at least one of the templates comprises two areas which have different properties with respect to their interaction with the nanosource material.

18. The method of claim 17, wherein the different properties of the areas with respect to their interaction with the nanosource material are brought about by letting one area have stronger adhesive properties than the other with respect to the nanosource material.

19. The method of claim 13, wherein a plurality of template areas are prepared on the substrate, said template areas being arranged so that a nanotube which is formed by a film of nanotube structure material formed on and subsequently exfoliated from one of these templates will interconnect with another nanotube which in a similar manner is exfoliated from a neighbouring template, thus forming one single continuous nanotube.

20. The method of claim 13, wherein at least one template area that has the stronger adhesive properties with respect to the nanosource material connects the two predetermined points on the substrate.

21. The method of any of claim 13, wherein the exfoliation is carded out by providing additional energy to the film of nanosource material.

22. The method of claim 21, wherein at least part of the additional energy is provided by at least one of a laser beam, ion beam and electron beam, which illuminates at least part of the film of nanosource material.

23. The method of claim 13, wherein the exfoliation is done by doping at least part of the material of the film of nanosource material.

24. The method of claim 21, wherein the additional energy is provided to a section of that part of the nanosource material which has been deposited on the area of the template which has the weaker adhesive properties.

25. The method of claim 13, wherein the films of nanotube source materials which are deposited on at least one of the templates is a film which will form a nanotube with different electrical properties compared to the electrical properties of a nanotube which will be formed by a film which is deposited on at least one of the other templates, thus giving the resulting total nanotube device semiconductor properties.

26. The method of claim 13, wherein the film of nanosource material which is caused to be deposited on the templates is a film of graphene.

27. The method of claim 26, wherein the tubes are given different electrical properties by virtue of the tubes having different chirality.

28. The method according to claim 13, wherein at least one of the two areas of the template is rectangular.

29. The method of claim 6, wherein the additional energy or doping is provided to a section of that part of the nanosource material which has been deposited on the area of the template whose material has the weaker adhesive properties.

30. The method of claim 7, wherein the additional energy or doping is provided to a section of that pain of the nanosource material which has been deposited on the area of the template whose material has the weaker adhesive properties.

31. The method of claim 14, wherein the contact point is prepared before the nanosource material is caused to exfoliate from its template.

32. The method of claim 14, wherein the contact point is prepared after the nanosource material is caused to exfoliate from its template.

33. The method of claim 22, wherein the additional energy is provided to a section of that part of the nanosource material which has been deposited on the area of the template which has the weaker adhesive properties.

34. The method of claim 23, wherein the additional energy or doping is provided to a section of that part of the nanosource material which has been deposited on the area of the template which has the weaker adhesive properties.

35. A method for manufacturing a nanostructure in-situ on a substrate, the method comprising:
    preparing the substrate;
    forming a template area on the substrate having a length and a width, the template area including a first region defining a releasing portion of the template and a second region defining a fixing portion of the template;
    forming a nanosource material film on the template area;
    releasing a first portion of the nanosource material film formed on the first region of the template area to form a free edge while fixing a second portion of the nanosource material film formed on the second region of the template area; and
    allowing the first portion of the nanosource material film to restructure whereby the free edge bonds to the second portion of the nanosource material film to form the nanostructure said restructuring being in the form of a reassembling on the atomic scale of the nanosource material, resulting in qualitatively new properties relative to the properties of the nanosource material prior to the restructuring, said new properties being manifested in an altered, pre-defined response to external fields or forces.

36. The method for manufacturing a nanostructure in-situ on a substrate according to claim 35, wherein:
    the nanosource material film comprises a single graphitic layer.

37. The method for manufacturing a nanostructure in-situ on a substrate according to claim 35, wherein:
    the nanosource material film comprises a plurality of graphitic layers.

38. A method for manufacturing an electronics device comprising: preparing a substrate;
    establishing two conductive points on the substrate;
    forming a template area in contact with both conductive points;
    establishing an electrical connection between a contact point for an external device and at least one of the conductive points;
    depositing a nanosource material film on the template area;
    releasing a first portion of the nanosource material film from a first region of the template area to form a free edge while fixing a second portion of the nanosource material film on a second region on the template area;
    restructuring the nanosource material film whereby the free edge bonds to the second portion of the nanosource material film to form a conductive nanotube that provides an electrical connection between conductive points.

39. The method for manufacturing an electronics device according to claim 38, wherein:
    the contact point coincides with one of the conductive points.

\* \* \* \* \*